(12) United States Patent
Kaminaga et al.

(10) Patent No.: US 6,257,215 B1
(45) Date of Patent: Jul. 10, 2001

(54) RESIN-SEALED ELECTRONIC APPARATUS FOR USE IN INTERNAL COMBUSTION ENGINES

(75) Inventors: Toshiaki Kaminaga, Naka-machi; Katsuaki Fukatsu, Urizura-machi; Ryoichi Kobayashi, Tojai-mura, all of (JP)

(73) Assignees: Hitachi, Ltd., Tokyo; Hitachi Car Engineering Co., Ltd., Hitachinaka, both of (JP)

( * ) Notice: Subject to any disclaimer, the term of this patent is extended or adjusted under 35 U.S.C. 154(b) by 0 days.

(21) Appl. No.: 09/531,764

(22) Filed: Mar. 20, 2000

(30) Foreign Application Priority Data

Mar. 18, 1999 (JP) .................................. 11-073437

(51) Int. Cl.$^7$ ........................................ F02P 3/00
(52) U.S. Cl. ................................. 123/647; 123/634
(58) Field of Search ........................ 123/634, 647

(56) References Cited

U.S. PATENT DOCUMENTS

| | | | | |
|---|---|---|---|---|
| 5,296,999 | * | 3/1994 | Taruya | 123/647 |
| 5,558,074 | * | 9/1996 | Fukatsu et al. | 123/647 |
| 5,622,157 | * | 4/1997 | Murata | 123/647 |
| 5,628,297 | * | 5/1997 | Taruya et al. | 123/647 |
| 5,662,091 | * | 9/1997 | Sawazaki et al. | 123/634 |
| 5,915,367 | * | 6/1999 | Oishi et al. | 123/647 |
| 5,927,259 | * | 7/1999 | Ando et al. | 123/634 |

FOREIGN PATENT DOCUMENTS 4-136484    5/1992 (JP) .

* cited by examiner

*Primary Examiner*—Erick Solis
(74) *Attorney, Agent, or Firm*—Crowell & Moring, L.L.P.

(57) ABSTRACT

A less-deformable resin-sealed electronic apparatus of high reliability capable of increasing the robustness (long lifetime) of soldered portions of a power semiconductor device for use in internal combustion engines while increasing the physical stiffness of an overall apparatus structure for achieving enhanced resistance to flexure or bending stresses is provided. A hybrid IC substrate 2 and power semiconductor device 3 are mounted on a metallic heat sink 1. The power semiconductor device 3 is coupled and contacted with the heat sink 1 by use of an Sn—Sb alloy-based solder material 4. The power semiconductor device 3 and hybrid IC substrate 2 plus heat sink 1 as well as input/output terminals 6-1 to 6-3 are embedded in a package 7 except for part of the input/output terminals, which package is made of epoxy at 70 to 90 weight percent (%) of an inorganic loading or filler material as machined by transfer mold techniques.

6 Claims, 4 Drawing Sheets

RESIN-SEALED ELECTRONIC APPARATUS FOR USE IN INTERNAL COMBUSTION ENGINES

BACKGROUND OF THE INVENTION

1. Technical Field of the Invention

The present invention relates generally to electronic apparatus including, but not limited to, electronic ignition devices (igniters) for use in internal combustion engines as mounted within engine room spaces of land vehicles, and more particularly to electronic devices having resin-sealed package structures.

2. Prior Art

One prior known structure of a semiconductor package for use in internal combustion engines, in particular, igniter modules, has been disclosed in Japanese Patent No. 2590601.

The prior art igniter package structure as taught thereby is designed so that a printed circuit board and a power transistor are integrally packed by transfer mold techniques using synthetic resin together with a heat release plate, known as a heat sink. In this prior art the power transistor packed is coupled to the heat sink via a heat spreader and dielectric plate lying therebetween.

Another prior art igniter device adapted for internal combustion engines is found in Japanese application patent laid-open publication No. Hei 8-69926, which is designed so that a controller circuit board and power switching device are built within the interior space of a heat sink as machined into a box-like shape. The power switching device is coupled thereto by a soldering material made of an Sn—Sb alloy on the heat sink, which alloy comprises a blend of tin (Sn) and antimony (Sb) at appropriate mixture ratios. The controller circuit board is bonded by silicon-based adhesive to the heat sink.

After having mounted these parts or components in the package structure, a silicon-based gel is injected into inside of the heat sink. The same Japanese document also discloses therein that the above-noted power transistor contact/junction technique using Sn—Sb alloy-based solder is also applicable to resin-sealed transistor package units (transfer-mold using epoxy) each including a power transistor only.

Still another prior art approach is disclosed in Japanese application patent laid-open publication No. Hei 9-177647, which teaches an ignition device having a semiconductor IC chip with function circuitry being integrated thereon.

Typically, electronic devices adaptable for use in internal combustion engines, such as igniters, are used under severe temperature conditions and, for the very reason, are the components that are strictly required to offer increased durability or robustness (long life-time). In addition, depending upon specifications required, some igniters are required to accommodate multiple functionalities.

These requirements are not met by the prior art one-chip IC package module discussed above. A need therefore exists to manufacture the power semiconductor device and its associated substrate or circuit board individually at separate process steps in order to fully satisfy the specification required.

In the semiconductor package structure for internal combustion engines, it is the power semiconductor switching device of significant self heat generation that is especially required to achieve the long lifetime issue.

More specifically, in view of the fact that currently available power semiconductor devices are typically made of silicon (Si), in cases where this Si is stacked on or over the heat sink, possible differences in linear expansion coefficient between Si and heat sink materials (for example, the linear expansion coefficient of Si is approximately $3 \times 10^{-6}/°$C. whereas a heat sink made of Cu measures about $17 \times 10^{-6}/°$C. in linear expansion coefficient) act to create unwanted stresses at soldered portions and thus are controlling the lifetime thereof.

With high-temperature Pb—Sn alloy-based solder materials (Pb:Sn=90:10) that have traditionally been employed as solders for use with electronic components of this type, these are not sufficient in absorbing such linear expansion coefficient differences and are thus remain difficult to attain long lifetime required. One known approach to avoiding this problem is to additionally employ a thermal relaxation member (made for example of molybdenum) which is laminated to reduce such linear expansion coefficient differences thereby making moderate or "relaxing" resultant stress forces.

It may be evaluated that in the event that the above-noted Pb—Sn alloy-based solder is replaced with an Sn—Sb alloy-based solder (for instance, made of Sn containing therein Sb at 5 to 8%, Ni at 0.0 to 0.8%, and P at 0.0–0.1%) for coupling or adhering between a power semiconductor device and its associated heat sink in a way as suggested by the above-identified Japanese application patent laid-open publication No. Hei. 8-69926.

This Sn—Sb alloy-based solder is inherently high in physical robustness or stiffness so that it becomes possible to decrease the propagation speed of thermal shocks occurring due to linear expansion coefficient differences between the power semiconductor device and the heat sink, which in turn makes it expectable to improve the durability at soldered portions.

SUMMARY OF THE INVENTION

It is therefore a primary objective of the present invention to provide a new and improved electronic apparatus capable of achieving enhanced durability (long life-time) at soldered portions of a power semiconductor device for use with internal combustion engines and also increasing stiffness of the entire structure thereof while offering increased resistance against bending or flexure stresses and yet reduced deformability and at the same time taking full advantage of such Sn—Sb alloy-based solder materials.

It is another object of the invention to accomplish the use of lead-less high-temperature solder materials for the overall structure of electronic apparatus in view of environmental problems.

(1) Electronic apparatus for use in internal combustion engines in accordance with the present invention is featured in that a substrate having a hybrid IC (referred to hereinafter as a "hybrid IC substrate") and a power semiconductor device are secured on a heat sink made of a metal, that said power semiconductor device is in contact with said heat sink by use of a soldering material comprised of an Sn—Sb alloy, and that this power semiconductor device and the hybrid IC substrate plus the heat sink as well as one or more input/output terminals are embedded in a package except for part of the input/output terminals, said package being made of epoxy at 70 to 90 weight percent of an inorganic filler material as machined by transfer mold techniques.

In accordance with another aspect of this invention, the power semiconductor device and the hybrid IC substrate plus the heat sink as well as part of input/output terminals are embedded in a transfer-molded epoxy package while this epoxy is preferably arranged so that the content amount of inorganic filler material thereof is specifically adjusted to permit its resultant linear expansion coefficient is midway in value between the linear expansion coefficient of said power semiconductor device and that of said heat sink.

In case an Sn—Sb alloy-based solder is employed as the solder material for use in contacting or coupling between the power semiconductor device (made of Si for example) and the heat sink (made of Cu for instance), effectuation of appropriate solder thickness management permits the Sn—Sb alloy-based solder to exhibit an action of suppressing thermal deformation (expansion, shrinkage) occurring due to linear expansion coefficient differences between Si and heat sink material.

Because of the fact that this Sn—Sb solder is inherently high in physical stiffness as discussed previously while simultaneously making it possible, by letting the transfer-molded epoxy package be high in composition ratio of inorganic filler materials (extremely higher than standard composition ratios) in the way stated above, for its linear expansion coefficient to be midway between the linear expansion coefficient of Si and that of the heat sink (Cu), for example, about $10 \times 10^{-6}/°C$., and further attaining a function of suppressing thermal expansion and shrinking deformation of the power semiconductor device and/or the heat sink.

Because of the fact that the epoxy containing therein inorganic filler materials at such high composition ratio is expected to more rigidly secure those electronics parts or components mounted within the package in the state that it is harder than traditional epoxy materials for use in standard dielectric molds.

Accordingly, it becomes possible to slow the propagation speed of thermal shocks than ever before, which shocks can occur due to linear expansion coefficient differences between the power semiconductor device and the heat sink. This in turn makes it possible to improve the durability or permanence properties at soldered portions of the power semiconductor device.

It is further noted that when applying transfer molding processes to the hybrid IC substrate mounted, careful attention should be paid to creation of flexure stresses in light of the fact that such hybrid IC substrate is generally designed to employ alumina-based ceramic materials.

In this case, use of Sn—Sb alloy-based solder with increased stiffness for coupling or junction of the power semiconductor device makes it possible to increase the stiffness of the heat sink supporting thereon the hybrid IC substrate, which in turn enables reduction of any possible deformability even upon application of flexure stresses to the hybrid IC substrate and/or the heat sink.

(2) A resin-sealed electronic apparatus in accordance a further aspect of the instant invention is featured in that a substrate having a hybrid IC and a power semiconductor device are secured on a heat sink made of a metal, that said power semiconductor device is in contact with said heat sink by use of a soldering material comprising an Sn—Sb alloy, that a conductive material on said hybrid IC substrate includes one of an Ag—Pt alloy-based conductor and Cu-based conductor while letting a solder material used for soldering of more than one component as mounted on said hybrid IC substrate be any one of Sn—Ag alloy-based solder and Sn—Ag—Cu alloy-based solder, and that said power semiconductor device and said hybrid IC substrate plus said heat sink as well as one or more input/output terminals are embedded except for part of the input/output terminals in a transfer-molded package made of synthetic resin.

With such an arrangement, it is possible to suppressing or "relaxing" thermal shocks at the power semiconductor device and heat sink while simultaneously taking full advantage of the Sn—Sb alloy-based soldering materials and further possible for those soldered portions of this power semiconductor device and other parts or components associated therewith to be well bonded using lead-less high-temperature soldering architectures.

DESCRIPTION OF THE INVENTION

Figure 1A:
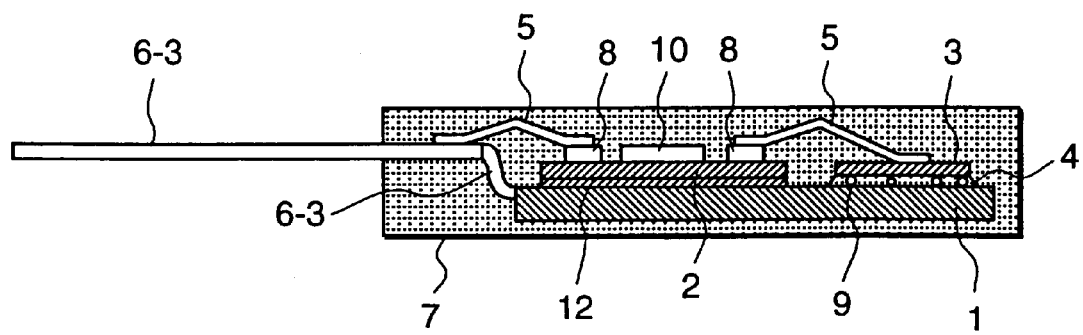
FIG. 1A is a diagram depicting a side view in cross-section of a resin-sealed electronic apparatus in accordance with one embodiment of the present invention.
Figure 1B:
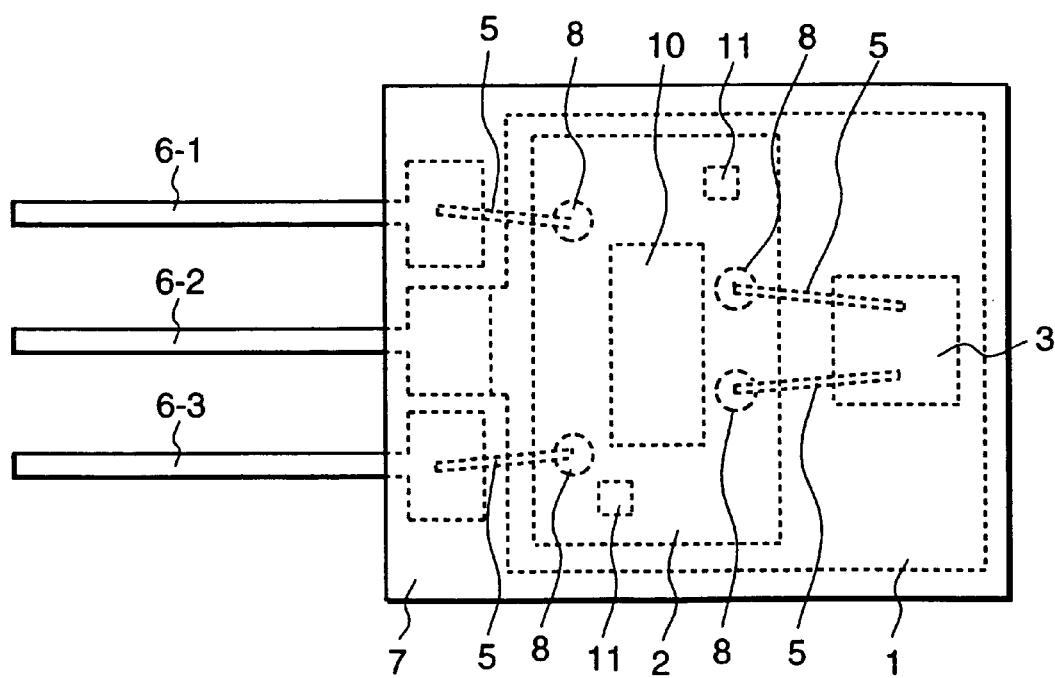
FIG. 1B is a diagram showing a plan view of FIG. 1A.
Figure 2:
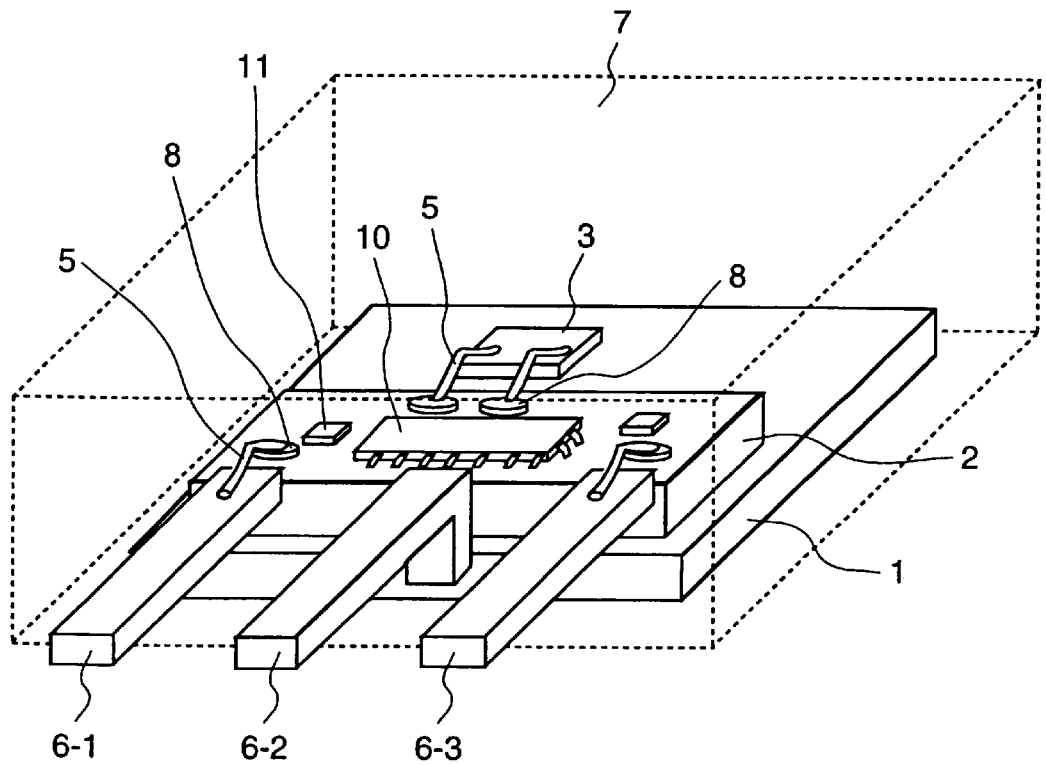
FIG. 2 illustrates a perspective view of an internal configuration of the embodiment above.

One preferred embodiment of the present invention will now be explained with reference to the accompanying figures of the drawing. FIG. 1A, FIG. 1B and FIG. 2 illustrate one exemplary igniter device as one example of resin-sealed electronic apparatus for use in internal combustion engines in accordance with one embodiment of this invention, wherein FIG. 1A depicts a side sectional view of the embodiment and FIG. 1B shows its plan view whereas FIG. 2 shows its plan view with an outer package housing eliminated for illustration purposes only.

In the drawings, reference numeral "1" is used to designate a heat sink that is made of either copper or aluminum; numeral 2 denotes a hybrid IC substrate (hybrid circuit board); 3 indicates a power semiconductor device.

Several parts or components that make up the required functions of the igniter are mounted (secured) on the substrate 2, which include a hybrid IC 10, chip capacitor 11, MIC and others. The power semiconductor device 3 is for use as a switching element that is operable to turn on and off a flow of primary current of an ignition coil or coils (not shown), and is typically formed of a power transistor or alternatively an insulated-gate bipolar transistor (IGBT) or else.

In the case of the IGBT used, it is possible to reduce heat generation of the switch device, which in turn is devoted to reduction or minimization of thermal stresses occurring due to self heat generation.

The power semiconductor device 3 is rigidly coupled for junction to the heat sink 1 by use of a chosen Sn—Sb alloy-based solder material 4. The Sn—Sb alloy-based solder 4 may be comprised of an Sn-based material that contains therein Sb at composition ratio of 5±0.5 weight percent (wt %), Ni at 0.6±0.2 wt %, P at 0.05±0.015 wt % as mixed therein, by way of example.

The Sn—Sb alloy-based solder is inherently less in wettability with respect to Cu or Al; thus, let those soldered portions of the heat sink 1 be subjected to Ni-metallizing/plating treatment of good affinity to a predetermined thickness of from 2 to 10 micrometers ($\mu$m) to thereby complete plating processes required, note here that while best results are expectable when the Ni-solder material used herein does not contain phosphors (P), better results are obtainable as long as this material is less than or equal to 10 wt % in content amount of P.

Additionally the Sn—Sb alloy-based solder 4 is readily oxidizable; thus, the soldering processes are done using oxidation-reduction furnaces at the atmosphere of hydrogen or nitrogen gases or alternatively any mixture gases thereof.

Also note that the Sn—Sb alloy-based solder 4 is specifically controlled so that it contains therein spherical metallic particles or "micro-metal balls" that measure 30 to 150 μm in diameter, thereby allowing the resultant solder to have a uniform thickness.

The micro-metal balls 9 may typically be made of certain metallic materials that are similar in value of linear expansion coefficient to Sn, which is the major component of the Sn—Sb alloy-based solder—that is, 10 to $30 \times 10^{-6}$/° C. In this way the intended soldering is achievable with reliability and stability much increased.

In view of the fact that the hybrid IC substrate 2 is machined using alumina-based ceramic materials and hardly exhibits any appreciable heat generation, this substrate is mounted on and adhered to the heat sink 1 by use of resin-based adhesive 13.

A conductive material (not depicted) on the hybrid IC substrate 2 is made of silver-platinum (Ag—Pt) alloy-based conductor or alternatively copper (Cu)-based one whereas Sn—Ag alloy-based or Sn—Ag—Cu alloy-based solders may be employed as the solder material for use in soldering those components mounted on this hybrid IC substrate 2 (including the capacitor 11 and wire bonding pads 8 and others). One typical composition of Sn—Ag alloy-based solder is such that Ag is contained in Sn at 1 to 4 weight percent (wt %).

In the case of the Sn—Ag—Cu alloy-based solder, Sn contains Ag at 1 to 4 wt % and Cu at 0.1 to 1 wt %. These solder materials are inherently higher in high-melting-point temperature than Sn—Sb alloy-based ones and thus offer an ability to suppress undesired outdiffusion of conductive substrate materials and solders at high temperatures in in-use environments and also offer a capability of improving the lifetime of soldered portions while simultaneously staying low in meltability at those temperatures during soldering-assembly of the power semiconductor device 3.

Numerals 6-1 to 6-3 are used to designate signal input/output terminals; for example, a signal input terminal 6-1 for use in inputting or receiving an ignition signal incoming from an engine controller unit (ECU) not shown, an output terminal 6-2 as connected to the collector of the power semiconductor device 3, and ground terminal 6-3.

The input/output terminals 6-1 to 6-3 are originally press-machined integrally with the heat sink 1 in a way such that these are formed from the same metal plate; of these terminals, two terminals 6-1 and 6-3 as electrically connected via conductors to the hybrid IC 10 are cut away and separated from the heat sink 1 to be electrically connected to the hybrid IC 10 by way of wires 5 and bonding pads 8 as well as conductor(s).

The remaining terminal 6-2, which is electrically connected to the power semiconductor device 2, is electrically connected to the power semiconductor device 3 via the heat sink 1 and Sn—Sb alloy-based solder 4 while it is kept integrally coupled to the heat sink 1.

For purposes of primary-side current control and ground connection of the power semiconductor device 3, the hybrid IC substrate 2 is electrically connected to the power semiconductor device 3 via aluminum wires 5 and pads 8.

The resultant electronic device assembly structure thus constituted (including the heat sink 1, hybrid IC substrate 2, power semiconductor device 3, aluminum wires 5, chip capacitor 4, MIC, and pads 8) and part of the input/output terminals 6-1 to 6-3 are embedded in a transfer-molded epoxy package 7 with an inorganic filler material at 70 to 90 wt % in composition ratio.

The inorganic filler material as compound in the epoxy package 7 may be a rounded filler, such as for example fused silica, in order to reduce or minimize risks of damage at semiconductor components, wherein use of such high compound inorganic filler material permits the epoxy to well adjusted to have its linear expansion coefficient which is midway in value between the linear expansion coefficient of the power semiconductor device (Si), $3 \times 10^{-6}$/° C., and that of heat sink (Cu), $17 \times 10^{-6}$/° C.; preferably, the intermediate value is set at about $10 \times 10^{-6}$/° C., or more or less, by way of example. Note here that in the case of alumina ceramics, its linear expansion coefficient is at about $7 \times 10^{-6}$/° C.

According to the embodiment product, upon inputting of an ignition signal from the external ECU via the terminal 6-1, the hybrid IC 10 operates to cause the power semiconductor device 3 to turn on and off in association with the primary current control generates on the secondary side of the ignition coil (not shown).

Although a difference in linear expansion coefficient between the constituent material, Si, of the power semiconductor device 3 having heat releasability and the material, Cu or Al, of the heat sink 1 is significant, it becomes possible to increase the resistivity to impact shocks or anti-shock properties at solder-contact portions of the power semiconductor device while lengthening the lifetime thereof because of the fact that the Sn—Sb alloy-based solder 4 used herein is greater in stiffness than currently available standard high-temperature solder materials (Pb:Sn=90:10 or therearound) and thus excellent in resistivity against heat cycles in association with use of the high compound inorganic filler-contained epoxy (transfer mold) 7.

More specifically, the Sn—Sb alloy-based solder 4 is such that owing to its high stiffness, an action takes place to suppress thermal deformation (expansion, shrinkage) occurring due to linear expansion coefficient differences between Si and heat sink material while at the same time making it possible, by letting the transfer-molded epoxy package 7 employ a specific inorganic filler material high in composition ratio of inorganic filler materials (much higher than standard composition ratios) in the way stated above.

For its linear expansion coefficient to stay midway between the linear expansion coefficient of Si and that of the heat sink (Cu), for instance, about $10 \times 10^{-6}$/° C., and further attaining a function of suppressing any possible thermal expansion and shrinking deformation of the power semiconductor device 3 and/or heat sink 1 because of the fact that the epoxy containing therein such high compound inorganic filler material is expected to more rigidly secure those electronics components mounted within the package 1 in the state that it is harder than traditional epoxy materials for use in standard dielectric molds.

Consequently, it becomes possible to decrease propagation speeds of thermal shocks than ever before, which shocks can occur due to linear expansion coefficient differences between the power semiconductor device 3 and the heat sink 1, which in turn makes it possible to improve the durability at soldered portions involved.

Furthermore, although when applying transfer molding processes to the mounted hybrid IC substrate 2 careful attention should be taken to creation of flexure stresses in view of the fact that such hybrid IC substrate is typically designed to employ alumina-based ceramic materials.

The illustrative embodiment is such that the use of Sn—Sb alloy-based solder 4 with increased stiffness for junction of the power semiconductor device makes it possible to increase the resulting stiffness of the heat sink that mounts the hybrid IC substrate, which in turn enables reduction or minimization of any possible deformability even upon application of flexure stresses to the hybrid IC substrate and/or the heat sink.

A further advantage of this embodiment lies in an ability to permit use of lead-free high-temperature solder materials for soldered portions in the overall device structure of this type, which is thus devoted to increases in environmental safety.

A still further advantage of the embodiment is that required parts or components are reduced in number as compared to prior art products as will be described later in the description while simultaneously reducing manufacturing costs through optimal design of process steps in the manufacture thereof.

Figure 3:
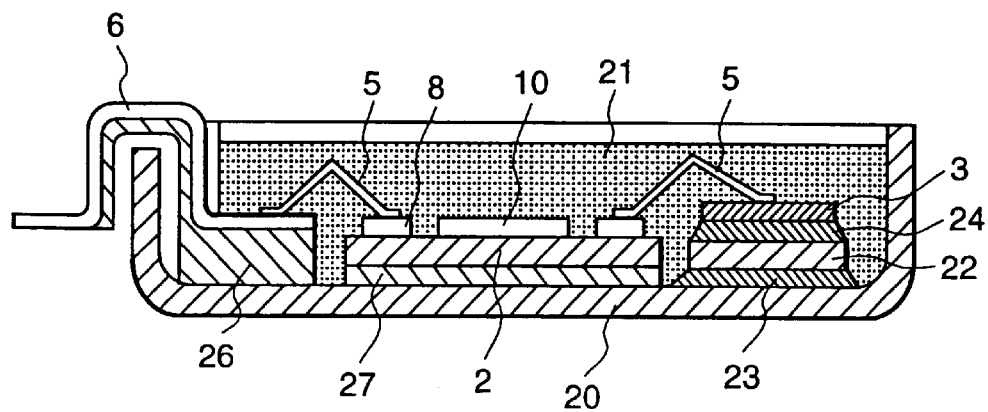
FIG. 3 illustrates a side sectional view of one prior known ignition device.

See FIG. 3, which shows a side sectional view of one prior art igniter. Additionally, the same or similar reference characters as used in this drawing designate the same or similar parts or elements as have been shown in FIGS. 1A, 1B and 2.

Numeral "20" denotes a heat sink as machined into a box-like shape, in which a hybrid IC substrate 2 and power semiconductor device 3 are mounted. The power semiconductor device 3 is coupled by using a Pb—Sn alloy-based solder material 24 to a molybdenum plate (serving as a thermal shock relaxation material) 22 that is soldered by silver (see numeral 23) on the heat sink 20. The hybrid IC substrate 2 is bonded by silicon-based adhesive 27 or else to the heat sink 2.

Figure 4:
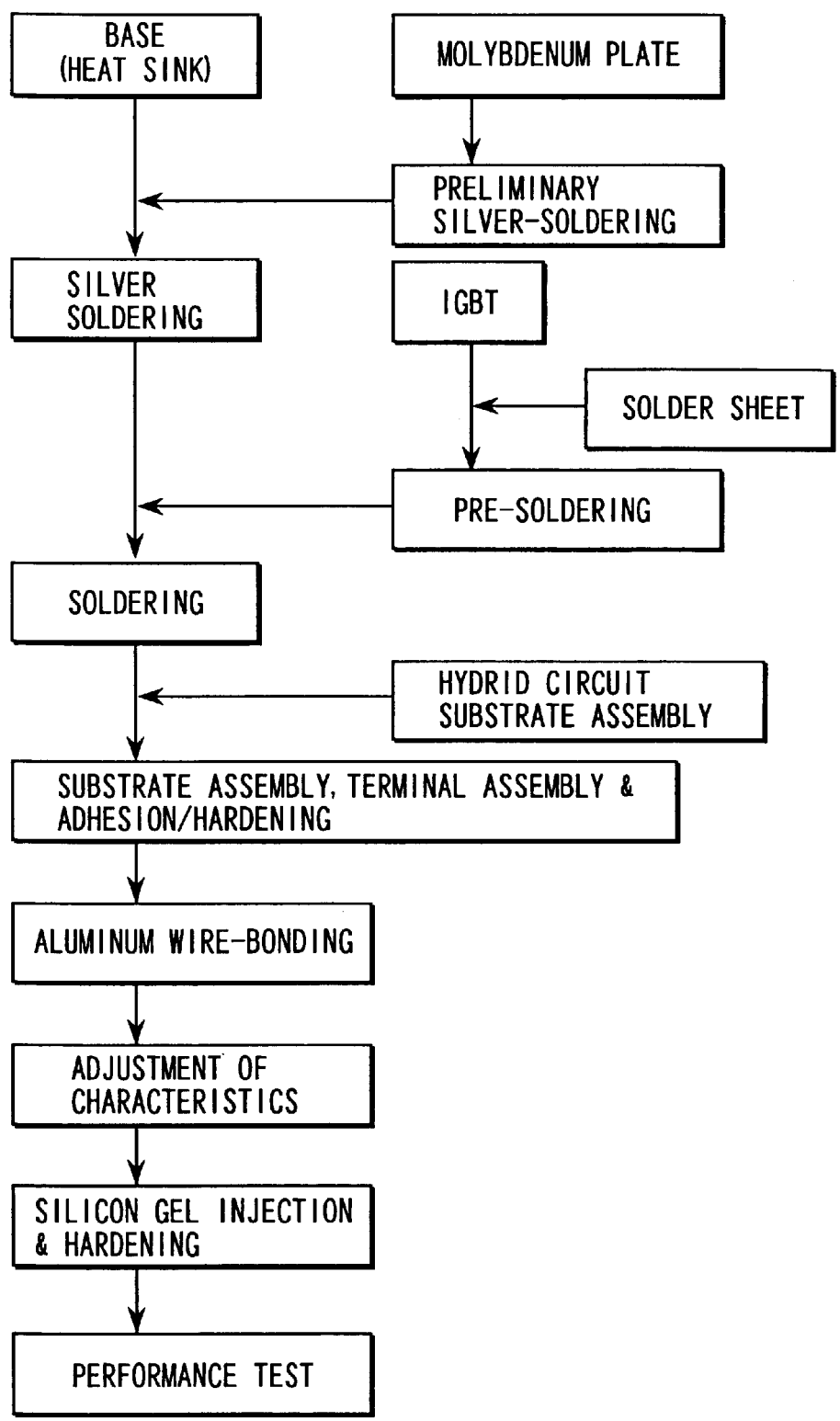
FIG. 4 is a flow diagram showing a series of assembly process steps of the prior art igniter.

Input/output terminals 6 are rigidly attached to a mold-machined terminal holder (terminal unit assembly) 26 in a way such that these are made integral together, wherein the terminal holder 26 is adhered to the heat sink 20. A series of assembly process steps thereof is shown in FIG. 4.

Figure 5:
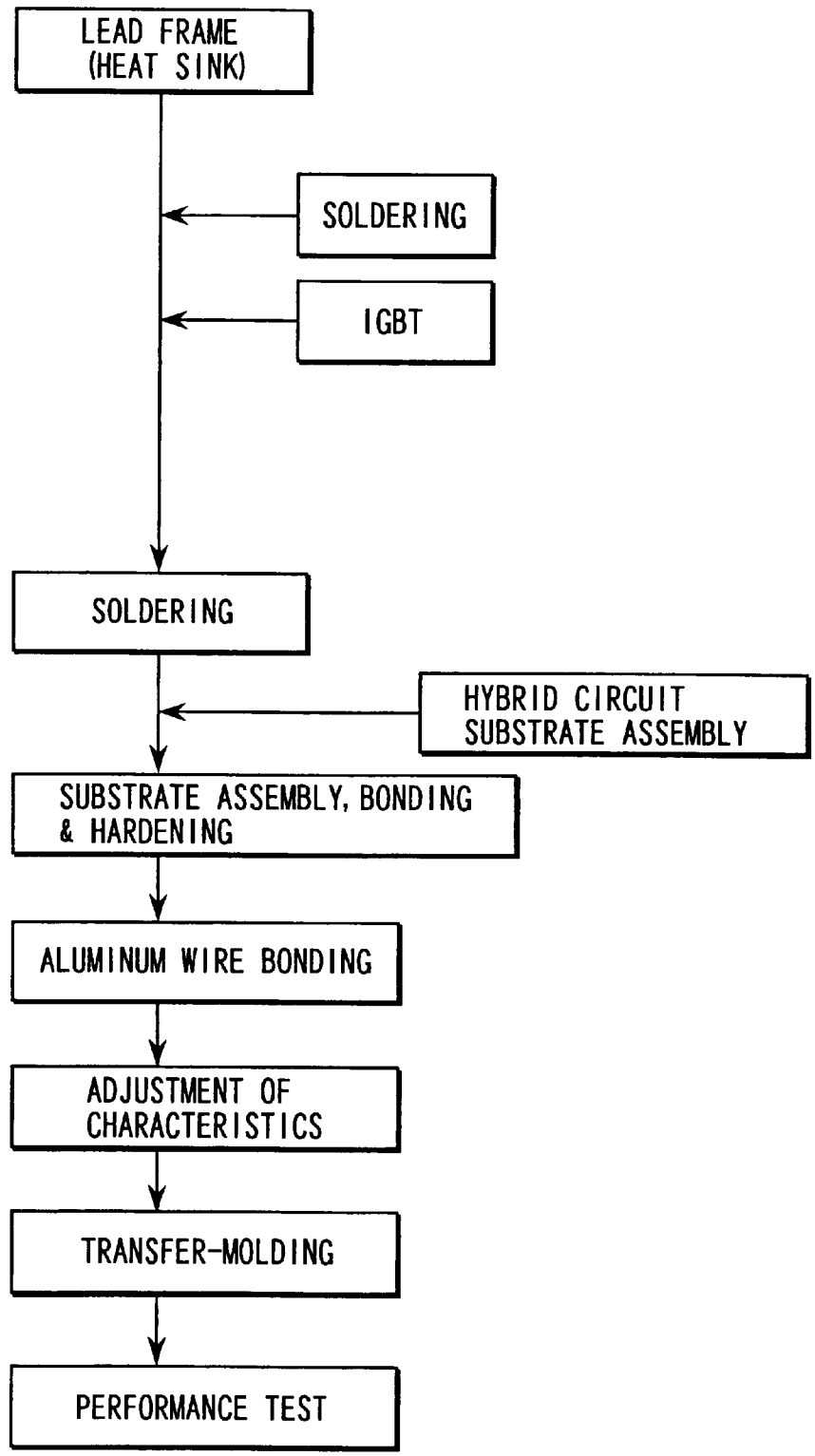
FIG. 5 is a flow diagram showing a series of assembly process steps of an igniter embodying the invention.

See next FIG. 5, which depicts a flow of assembly process steps in the manufacture of the embodiment stated supra. As will be readily occur to any person skilled in the art by viewing FIG. 5 in comparison with FIG. 4, this embodiment is arranged so that the electronic apparatus's constituent components excluding part of the input/output terminals (external connection terminal) are embedded or buried in a transfer-mold epoxy package, and offers when compared to the prior art the following advantages:

The embodiment does no longer require use of the molybdenum plates and also avoids the need for attachment of the terminal unit assembly to the heat sink along with adhesion works and silicon gel injection/hardening processes, which in turn enables considerable reduction in number of parts and process steps concerned.

In accordance with the illustrative embodiment, it is possible to further improve than ever before the robustness (long lifetime) of soldered portions of a power semiconductor device for use in internal combustion engines which is used under severe temperature environment conditions, while at the same time making it possible to provide at low production costs the intended high-reliability electronic apparatus that is strong against bending stress forces and thus is less deformable with stiffness properties being increased relative to an overall apparatus structure.

Furthermore, it is possible to permit the entire structure of such electronic apparatus to achieve use of high-temperature soldering without use of any lead (Pb) materials, which in turn is devoted to improvements in environmental safeties.

What is claimed is:

1. A resin-sealed electronic apparatus for use in an internal combustion engine, characterized in that a substrate having a hybrid IC (referred to hereinafter as a "hybrid IC substrate") and a power semiconductor device are secured on a heat sink made of a metal, that said power semiconductor device is in contact with said heat sink by use of a soldering material comprised of an Sn—Sb alloy, and that this power semiconductor device and the hybrid IC substrate plus the heat sink as well as one or more input/output terminals are embedded in a package except for part of the input/output terminals, said package being made of epoxy at 70 to 90 weight percent of an inorganic filler material as machined by transfer mold techniques.

2. A resin-sealed electronic apparatus for use in an internal combustion engine as recited in claim 1, characterized in that said power semiconductor device is a power semiconductor switching device for use in permitting and interrupting a flow of primary current of an ignition coil of the internal combustion engine, and that said hybrid IC substrate has a function of controlling the primary current of said ignition coil.

3. A resin-sealed electronic apparatus for use in an internal combustion engine as recited in claim 1, characterized in that said input/output terminals are originally press-machined integrally with said heat sink by use of an identical metallic plate, that selected ones of the terminals as electrically connected to said hybrid IC are cut and separated from said heat sink and are connected via wire bonding to the hybrid IC, and that those terminals being electrically connected to said power semiconductor device are integrally coupled to said heat sink and then connected via said heat sink and said Sn—Sb alloy-based solder material to said power semiconductor device.

4. A resin-sealed electronic apparatus for use in an internal combustion engine as recited in claim 1, characterized in that said Sn—Sb alloy-based solder material contains therein spherical metal of 30 to 150 micrometers in diameter to thereby control a film thickness of the solder.

5. A resin-sealed electronic apparatus for use in an internal combustion engine, characterized in that a substrate having a hybrid IC and a power semiconductor device are fixed on a heat sink made of a metal, that said power semiconductor device is coupled and contacted with said heat sink by use of an Sn—Sb alloy-based soldering material, that this power semiconductor device and the hybrid IC substrate plus the heat sink as well as one or more input/output terminals are embedded except for part of the input/output terminals in a package made of epoxy at 70 to 90 weight percent of an inorganic filler material as machined by transfer mold methods, and that this epoxy is such that the inorganic filler material is adjusted in amount of content to permit a linear expansion coefficient to be set at a value midway between a linear expansion coefficient of said power semiconductor device and a linear expansion coefficient of said heat sink.

6. A resin-sealed electronic apparatus for use in an internal combustion engine, characterized in that a substrate having a hybrid IC and a power semiconductor device are secured on a heat sink made of a metal, that said power semiconductor device is in contact with said heat sink by use of a soldering material comprising an Sn—Sb alloy, that a conductive material on said hybrid IC substrate includes one of an Ag—Pt alloy-based conductor and Cu-based conductor while letting a solder material used for soldering of more than one component as mounted on said hybrid IC substrate be any one of Sn—Ag alloy-based solder and Sn—Ag—Cu alloy-based solder, and that said power semiconductor device and said hybrid IC substrate plus said heat sink as well as one or more input/output terminals are embedded except for part of the input/output terminals in a transfer-molded package made of synthetic resin.

* * * * *